United States Patent [19]
Lee

[11] Patent Number: 5,748,529
[45] Date of Patent: May 5, 1998

[54] INTEGRATED CIRCUIT MEMORY DEVICES HAVING DIRECT READ CAPABILITY

[75] Inventor: Hyong-Gon Lee, Kyungki-do, Rep. of Korea

[73] Assignee: Samsung Electronics Co., Ltd., Suwon, Rep. of Korea

[21] Appl. No.: 749,332

[22] Filed: Nov. 14, 1996

[30] Foreign Application Priority Data

Nov. 15, 1996 [KR] Rep. of Korea ............... 95-41506

[51] Int. Cl.⁶ ........................................ G11G 16/06
[52] U.S. Cl. ........................ 365/185.17; 365/185.25
[58] Field of Search ...................... 365/185.17, 185.12, 365/185.25, 189.11, 203

[56] References Cited

U.S. PATENT DOCUMENTS

| | | | |
|---|---|---|---|
| 4,905,197 | 2/1990 | Urai | 365/185.25 |
| 4,999,812 | 3/1991 | Amin | 365/185.26 X |
| 5,237,534 | 8/1993 | Tanaka et al. | 365/182.25 X |
| 5,268,867 | 12/1993 | Momodomi et al. | 365/185.21 |
| 5,440,506 | 8/1995 | Longway et al. | 365/104 |

*Primary Examiner*—David C. Nelms
*Assistant Examiner*—Son Mai
*Attorney, Agent, or Firm*—Myers, Bigel, Sibley & Sajovec, L.L.P.

[57] ABSTRACT

Integrated circuit memory devices having direct read capability eliminate the use of page buffers to retain bit line data during reading operations. The page buffer is replaced by a plurality of PMOS pull-up transistors which are coupled through NMOS pass transistors to respective bit lines and also directly to inputs of a column selection circuit. A PMOS pull-up transistor and sense amplifier are also preferably provided at an output of the column selection circuit so that respective bit lines can be read one-at-a-time upon sequential application of a plurality of column address signals to the column selection circuit. The output of the sense amplifier is then provided to an output buffer which is typically electrically connected to an I/O pad.

18 Claims, 4 Drawing Sheets

5,748,529

INTEGRATED CIRCUIT MEMORY DEVICES HAVING DIRECT READ CAPABILITY

FIELD OF THE INVENTION

The present invention relates to integrated circuit semiconductor devices, and more particularly to integrated circuit memory devices.

BACKGROUND OF THE INVENTION

Semiconductor memory devices for storing data can typically be categorized as either volatile memory devices or nonvolatile memory devices. Volatile memory devices lose their stored data when their power supplies are interrupted, however nonvolatile memory devices retain their stored data even when their power supplies are interrupted. Thus, nonvolatile memory devices are widely used in applications where the possibility of power supply interruption is present.

Conventional nonvolatile memory devices include a type of electrically erasable programmable read only memory (EEPROM) device typically referred to as a flash EEPROM device. Flash EEPROM devices typically include a semiconductor substrate of first conductivity type (e.g., P-type), spaced source and drain regions of second conductivity type (e.g., N-type) in the substrate, a channel region at a face of the substrate, between the spaced source and drain regions, a floating gate for storing charge carriers when the device is programmed and a control gate which overlies the floating gate, opposite the channel region. Operation of a flash EEPROM device is typically divided into three modes including programming, erasing and reading.

Programming of a flash EEPROM device is typically achieved by biasing the drain region to a first positive bias, relative to the source region, and biasing the control gate to a second positive bias which is greater than the first positive bias. In the absence of any stored charge on the floating gate, these biases cause the formation of an inversion-layer channel of electrons at the face of the substrate, between the source and drain regions. As will be understood by those skilled in the art, the drain-to-source voltage accelerates these electrons through the channel to the drain region where they acquire sufficiently large kinetic energy and are typically referred to as "hot" electrons. The larger positive bias on the control gate also establishes an electrical field in a tunneling oxide layer which separates the floating gate from the channel region. This electric field attracts the hot electrons and accelerates them toward the floating gate, which is disposed between the control gate and the channel region, by a process known as tunneling. The floating gate then accumulates and traps the accumulated charge. Fortunately, the process of charging the floating gate is self-limiting. The negative charge that accumulates on the floating gate reduces the strength of the electric field in the tunneling oxide layer to the point where it is no longer capable of accelerating "hot" electrons from the drain side of the channel region.

As will be understood by those skilled in the art, the accumulation of a large quantity of trapped charge (electrons) on the floating gate will cause the effective threshold voltage ($V_{th}$) of the field effect transistor comprising the source region, drain region, channel region and control gate to increase. If this increase is sufficiently large, the field effect transistor will remain in a nonconductive "off" state when a predetermined "read" voltage is applied to the control gate during a read operation (i.e., $V_{th} > V_{read}$). In this state, known as the programmed state, the EEPROM device may be said to be storing a logic 0. Once programmed, the EEPROM device retains its higher threshold voltage even when its power supply is interrupted or turned off for long periods of time.

Erasing of the EEPROM device may also be achieved by removing the stored charge from the floating gate. The erasure process can be achieved, for example, by grounding the control gate and applying a positive bias to the substrate (e.g., 10–20 Volts). Accordingly, flash EEPROM devices typically require bulk erasure of large portions of an array of cells since the effects of applying a large substrate bias typically cannot be confined to a single EEPROM cell.

Reading of the EEPROM device is achieved by applying a predetermined read voltage ($V_{read}$) to the control gate, typically via a word line connecting a row (i.e., page) of identical EEPROM devices or "cells", and applying a positive bias to the drain region, typically via a bit line connecting a column of identical EEPROM cells. If the EEPROM device is programmed, it will not conduct drain current ($I_{ds}$) and the bit line will remain at the positive bias. However, if the EEPROM device has not been programmed (or has been erased), it will heavily conduct and pull the bit lie down to ground potential (GND). In this state, the EEPROM device may be said to be storing a logic 1. Thus, by monitoring the bit line current and voltage, the programmed state (i.e., 1 or 0) of the EEPROM device can be determined.

Conventional flash EEPROM integrated circuit memory devices may contain column-by-column arrays of NAND strings of EEPROM cells having the general construction illustrated in cross-section and schematically by FIGS. 11.58 and 11.59 from a handbook by B. Prince et al. entitled *Semiconductor Memories*, John Wiley & Sons Ltd., pp. 603–604 (1991); and in an article by M. Momodomi et al. entitled *An Experimental 4-Mbit CMOS EEPROM with a NAND Structured Cell*, IEEE Journal of Solid State Circuits, Vol. 24, No. 5, p. 1238 October (1989). An exemplary memory device containing EEPROM cells is also illustrated by FIG. 1. The memory device of FIG. 1 contains a plurality of NAND strings 20 arranged as a two-dimensional array of memory cells 200. The array of memory cells is arranged as a plurality of pages of memory cells electrically coupled to a respective plurality of word lines WL0-WLn and a plurality of columns of memory cells electrically coupled to a respective plurality of bit lines BL1-BLi. An X-decoder 10 is also provided to designate, among other things, a page of memory cells to be read during a memory read operation.

As will be understood by those skilled in the art, a memory read operation may be performed using conventional page read buffers such as the page read buffer 30 of FIG. 1 which is controlled in accordance with the timing diagram illustrated by FIG. 2. Here, a page read operation can be performed by initially discharging nodes D by applying a logic 1 pulse to nodes P and A to turn on NMOS transistors N3 and N4. By discharging node D, the respective bit line BL, which is electrically coupled to node D through a depletion-mode transistor DT, is also discharged. The bit lines BL1-BLi are then precharged by switching input B from 1→0 to pull node D up to Vcc using PMOS transistor P1. Input B is then switched from logic 0 to an intermediate potential (e.g., 1.7 Volts) so that transistor P1 is only partially conductive and acts as a load resistor. Thereafter, data from a page of memory cells are provided to the bit lines BL using operations well known to those skilled in the art. For example, if a selected EEPROM memory cell in an addressed page has been programmed to store a logic 0 value, the memory cell will remain "off" and the respective bit line and node D will remain in a precharged logic 1 state. However, if the selected EEPROM memory cell has not been programmed, the memory cell will turn-on and pull the respective bit line and node D to a logic 0 state.

The state of the selected memory cell is then recorded at node E by applying a logic 1 latch pulse C during time interval DS ("data sense") to turn on NMOS transistor N5. Accordingly, if a selected memory cell has been programmed, NMOS transistor N6 will also turn on to switch node E to a logic 1 state. Here, inverters I1 and I2 provide a latching feature. However, if the selected memory cell has not been programmed, NMOS transistor N6 will not turn on and node E will remain in a logic 0 state as initially established when logic 1 pulses were applied to nodes A and P. The column selection circuit, which is responsive to column address signals YA0-YAi and YB0-YBi, can then be operated to sequentially electrically connect node E of each page buffer 30 cell one-at-a-time to an output buffer 50.

Unfortunately, the size of the page buffer 30 for large arrays of memory cells 200 can be appreciable and can significantly reduce the integration density of the memory device. Accordingly, notwithstanding the above described memory device, there continues to be a need for more highly integrated memory devices.

SUMMARY OF THE INVENTION

It is therefore an object of the present invention to provide improved integrated circuit memory devices.

It is another object of the present invention to provide more highly integrated memory devices.

It is still another object of the present invention to provide integrated circuit memory devices having reduced complexity.

These and other objects, features and advantages of the present invention are provided by integrated circuit memory devices having direct bit line read capability. The ability to read the bit lines of a memory array directly is achieved by eliminating the use of page buffers to retain bit line data during reading operations. According to a preferred embodiment, a page buffer is replaced by a plurality of PMOS pull-up transistors which are coupled through NMOS pass transistors to respective bit lines and also directly to inputs of a column selection circuit. A PMOS pull-up transistor and sense amplifier are also preferably provided at an output of the column selection circuit so that respective bit lines can be read one-at-a-time upon sequential application of a plurality of column address signals to the column selection circuit. The output of the sense amplifier is then provided to an output buffer which is typically electrically connected to an I/O pad.

In particular, a preferred integrated circuit memory device according to the present invention comprises an array of memory cells arranged as a plurality of pages of memory cells electrically coupled to a respective plurality of word lines and a plurality of columns of memory cells electrically coupled to a respective plurality of bit lines. A bit line precharge circuit, comprising a plurality of PMOS pull-up transistors, is also provided to precharge the bit lines prior to performance of a read operation. A column selection circuit is also provided. The column selection circuit, which is also coupled to the plurality of bit lines, selectively connects each of the plurality of bits lines one-at-a-time to an output thereof in response to a column address signal. A PMOS pull-up transistor is also provided to precharge the output of the column selection circuit. In addition, a sense amplifier is provided to sense (i.e., "read") and amplify and drive the output of the column selection circuit to first or second binary logic potentials which indicate a state of a memory cell in the array.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
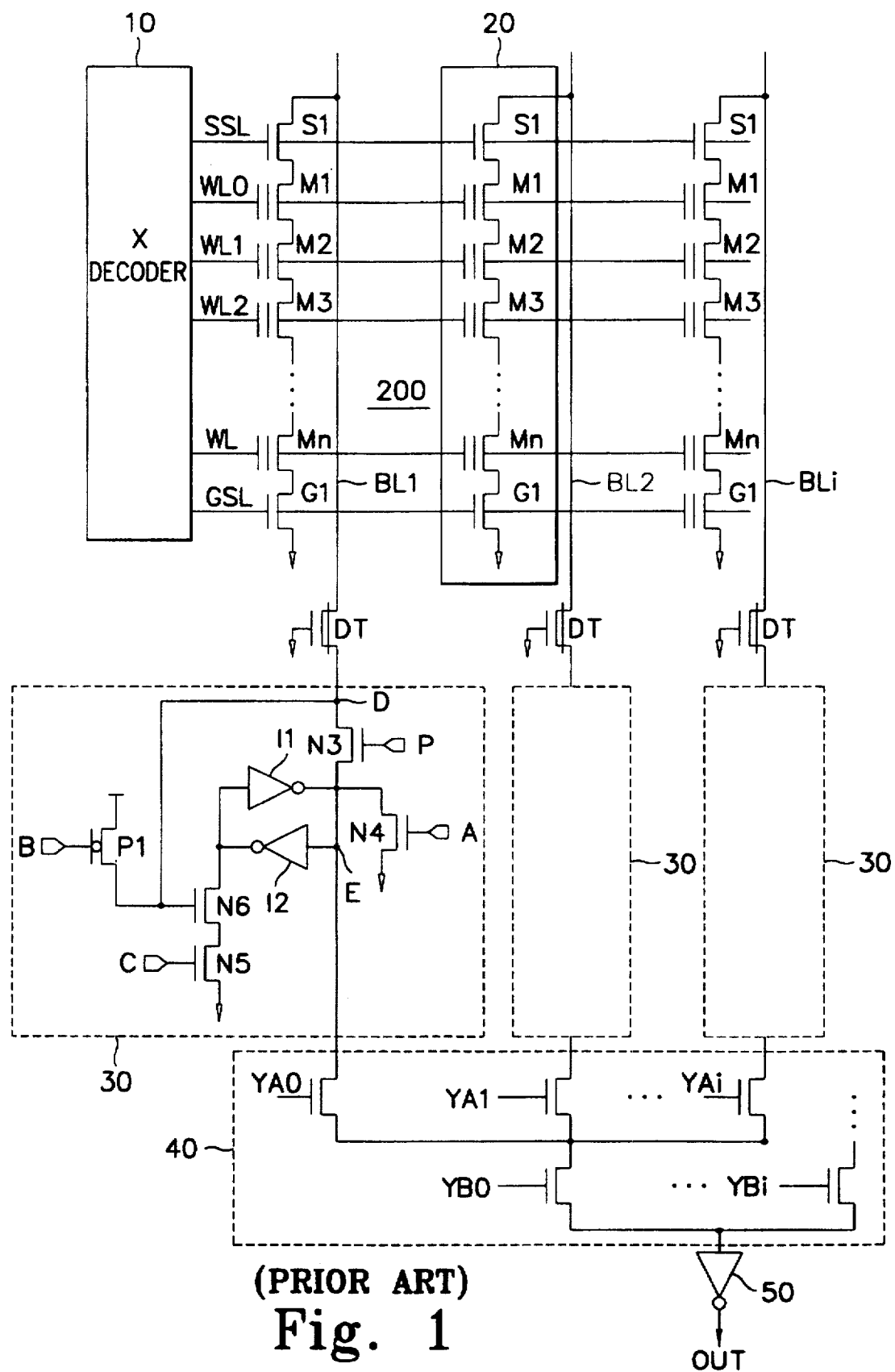
FIG. 1 illustrates an electrical schematic of an integrated circuit memory device containing strings of NAND cells and a page buffer, according to the prior art.
Figure 2:
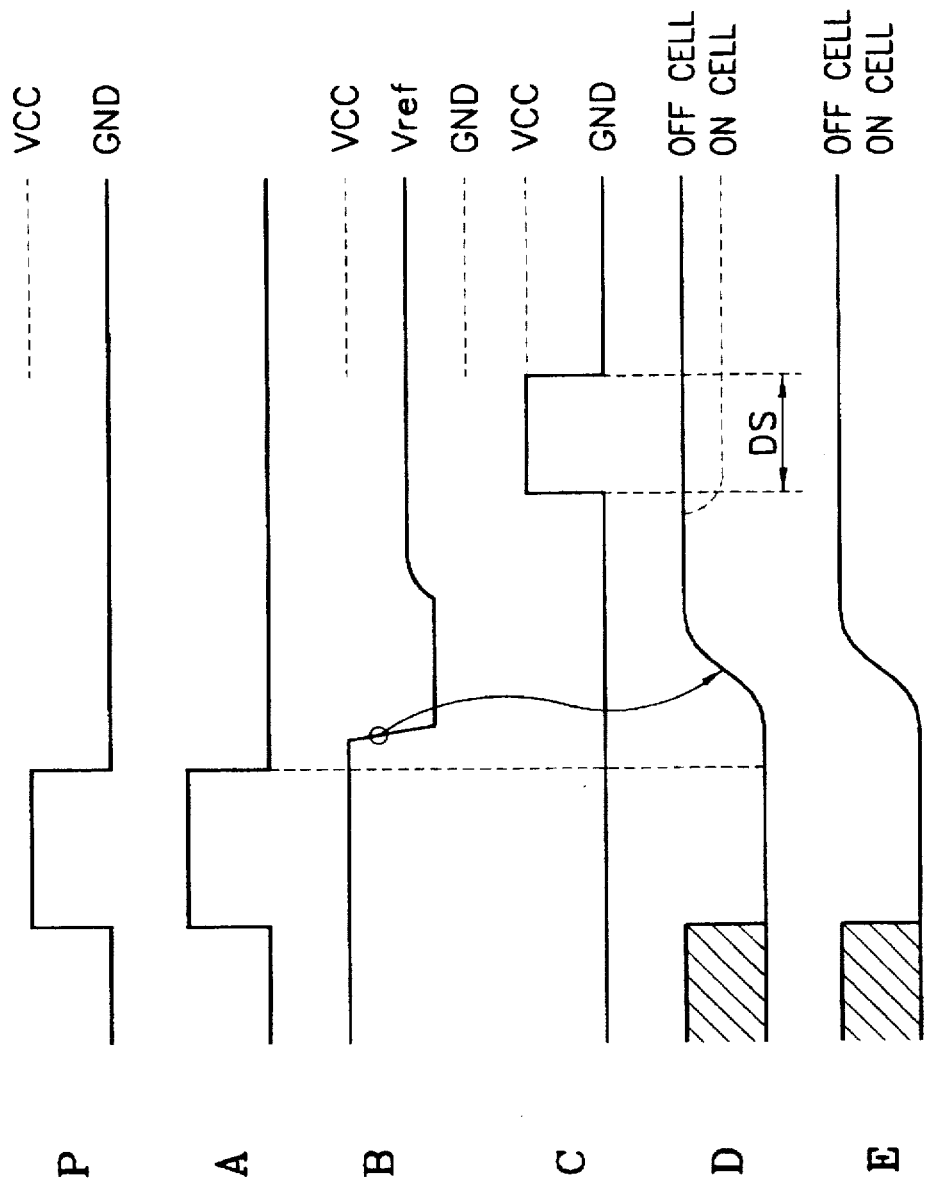
FIG. 2 is a diagram illustrating the timing of signals for performing a page read operation using the memory device of FIG. 1.
Figure 3:
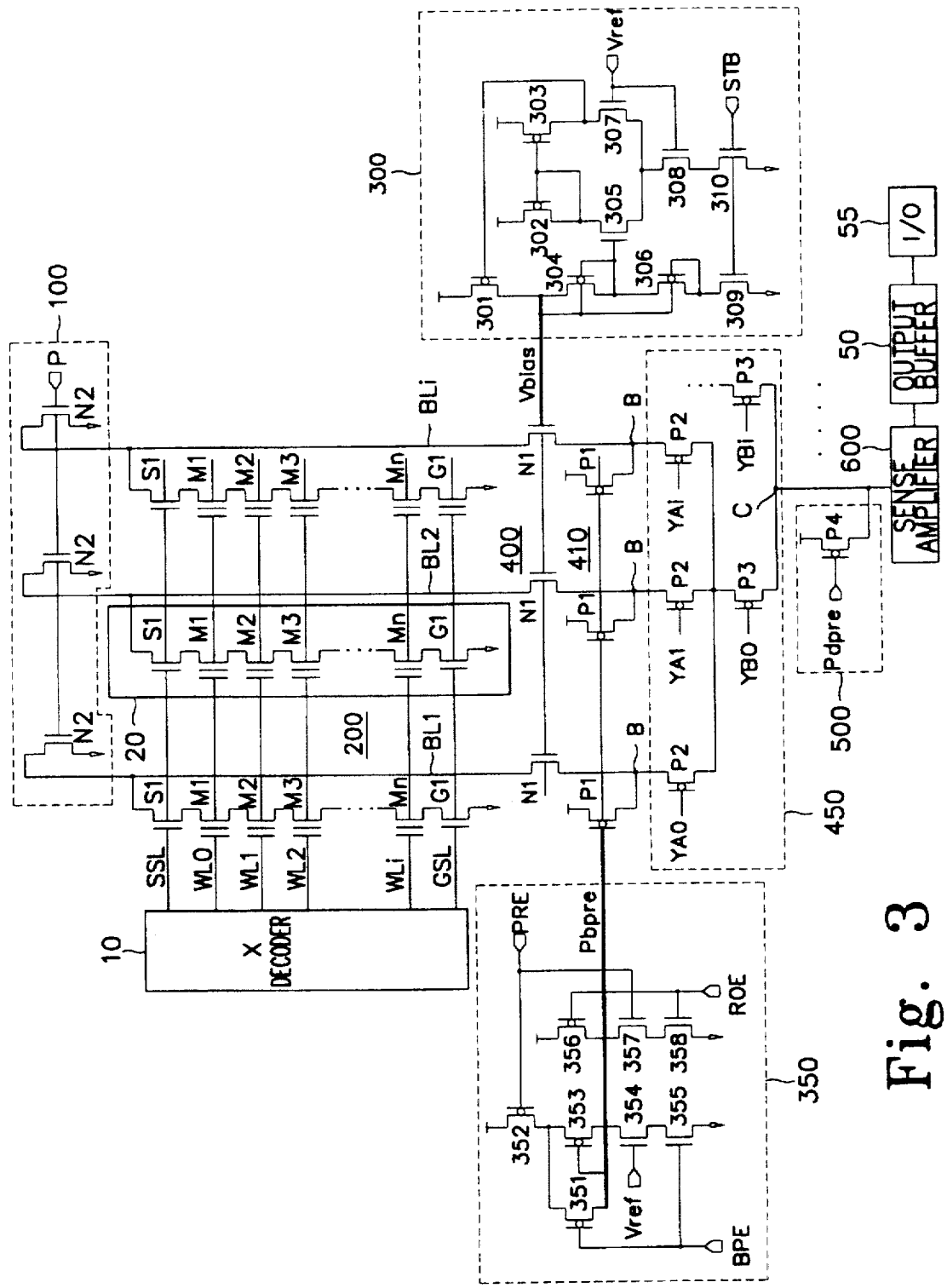
FIG. 3 illustrates an electrical schematic of an integrated circuit memory device according to one embodiment of the present invention.
Figure 4:
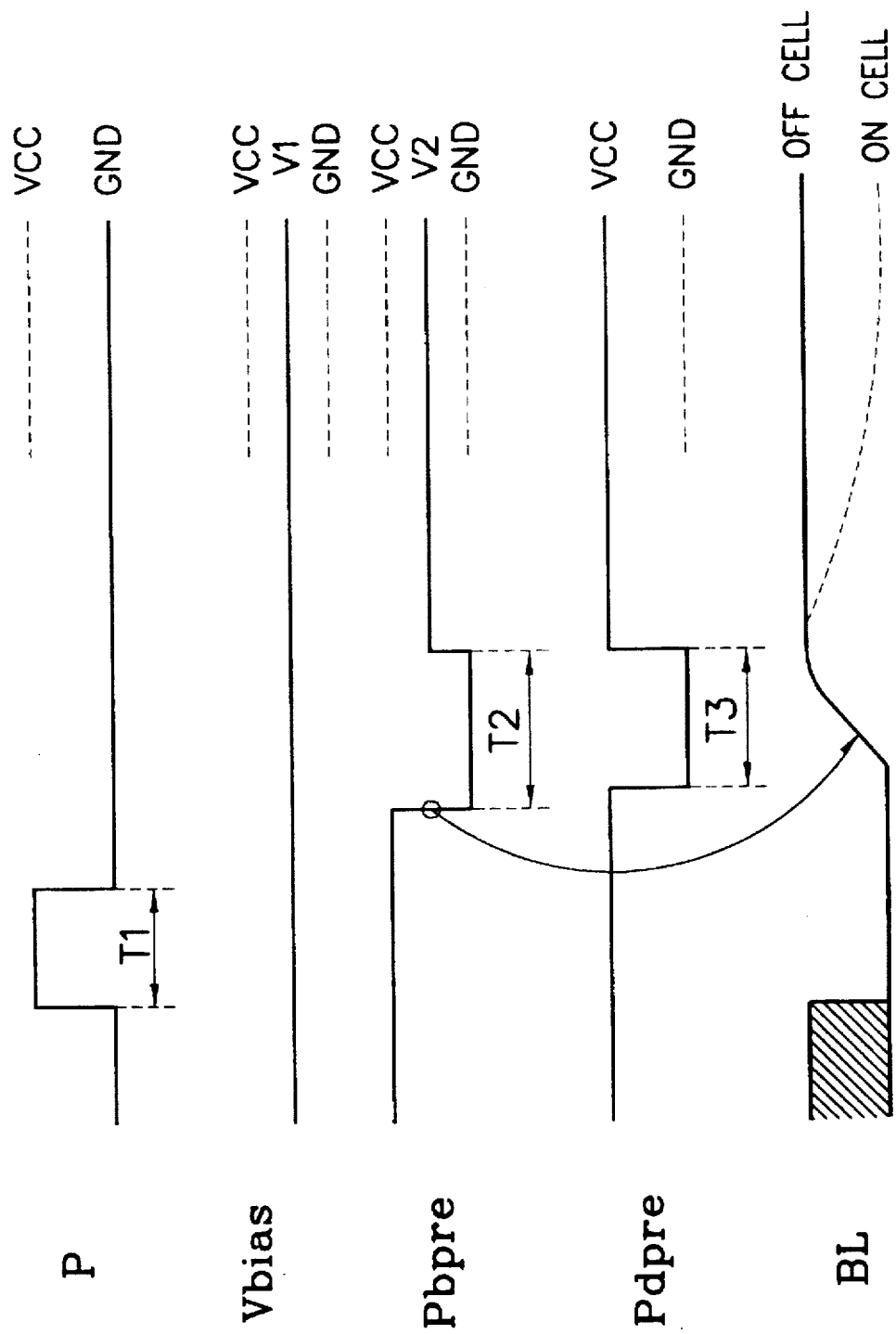
FIG. 4 is a diagram illustrating the timing of signals for reading data from the memory device of FIG. 3.

Referring now to FIGS. 3–4, a preferred embodiment of an integrated circuit memory device having direct bit line read capability will now be described. In particular, the memory device of FIG. 3 eliminates the need to include relatively large N-bit page buffers such as the buffer 30 of FIG. 1, by simplifying the read circuitry to include a plurality of PMOS pull-up transistors (to precharge the bit lines during initiation of a read operation), a plurality of pull-down transistors (to discharge the bit lines) and a single one-bit sense amplifier at the output of a column selection circuit.

For example, as illustrated by FIG. 3, a memory device according to the present invention may include a row decoder 10 and an array 200 of EEPROM cells arranged as a plurality of pages or rows connected by respective word lines WL0-WLi and a plurality of NAND strings or columns connected to respective bit lines BL1-BLi. In addition, means is provided for discharging the bit lines by pulling down the bit lines to a logic 0 potential (e.g., GND) in response to a discharge signal and for precharging the bit lines in response to a first precharge signal. Here, the preferred discharging means comprises a plurality 100 of NMOS pull-down transistors N2 which are responsive to signal P and the preferred precharging means comprises a plurality 410 of PMOS pull-up transistors P1 which are responsive to signal Pbpre. As illustrated, the pull-down transistors N2 are directly coupled to the bit lines BL1-BLi and the pull-up transistors P1 are coupled to the bit lines by a plurality 400 of NMOS pass transistors N1 which are responsive to signal Vbias. The signal Pbpre is illustrated as being provided by a generator consisting of NMOS and PMOS transistors 351–358 and the signal Vbias is illustrated as being provided by a generator consisting of NMOS and PMOS transistors 301–310.

A column selection circuit 450 is also provided for connecting nodes B one-at-a-time to an output thereof at node C. As illustrated, the column selection circuit 450 is responsive to column address signals YA0-YAi and YB0-YBi. Because the column selection circuit 450 is comprised of PMOS transistors P2 and P3, a column address signal of YA=011 . . . 1 and YB=011 . . . 1 will electrically connect node B corresponding to bit line BL1 to the output node C. A sense amplifier 600 is also provided for sensing the potential of node C and amplifying the sensed potential to a first or second binary logic potential (i.e., logic 0 or 1) to indicate the state of the selected node B and corresponding selected memory cell. For example, if the above column address is applied and the selected memory cell in the first NAND string is programmed to have a high threshold voltage (i.e., "off"), then nodes B and C will remain at a logic 1 potential during a read operation. However, if the selected memory cell is unprogrammed to have a low threshold voltage (i.e., normally "on"), then nodes B and C will be pulled to a logic 0 potential during the read operation. To assist the sense amplifier 600, means 500 is also provided for precharging the output node C of the column selection circuit 450 in response to a second precharge signal. Here, the output node C of the column selection circuit 450 is precharged by a single PMOS pull-up transistor P4 which is responsive to signal Pdpre. An output buffer 50, such as an inverter, and I/O pad 55 are also provided so that the data retained by the memory cells can be serially transmitted to an external device.

As illustrated best by the timing diagram of FIG. 4, a read operation may be performed by initially discharging the bit lines BL1-BLi, by applying a logic 1 pulse during time interval T1 to the pull-down transistors N2, and then precharging the bit lines by applying a logic 0 pulse during time interval T2 to the pull-up transistors P1. Here, nodes B are electrically connected to respective bit lines by the pass transistors N1 which have been turned on by the generation of a logic 1 potential equal to V1 by the Vbias generating circuit 300. At the end of interval T2, the pull-up transistors remain only partially conductive (to act as a pull-up load resistor) by generating Pbpre at a potential equal to V2. During time interval T3, the output of the column selection circuit 450 is also precharged by applying a logic 0 pulse to Pdpre to turn PMOS transistor P4 on for a short duration. Data from a selected memory cell is then read and the respective bit line is switched to a logic 0 potential to indicate that the memory cell is not programmed or is held at a logic 1 potential to indicate that the memory cell is programmed. Appropriate column address signals are then applied to sequentially electrically connect each of the nodes B to the output node C so that data in a page of memory cells can be transmitted serially by the output buffer 50 to the I/O pad 55.

Accordingly, the present invention allows for the performance of a direct bit line read operation without requiring the use of a relatively large page buffer. Instead, the page buffer is replaced by a plurality of pull-down and pull-up transistors which require significantly less chip area. In addition, although a sense amplifier is required to sense and amplify the output of the column selection circuit, only a single-bit sense amplifier of relatively small size is required which means that significant overall savings in area can be achieved to obtain higher overall integration densities.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
    an array of memory cells arranged as a plurality of pages of memory cells electrically coupled to a respective plurality of word lines and a plurality of columns of memory cells electrically coupled to a respective plurality of bit lines;
    means, electrically coupled to the plurality of bit lines, for precharging the plurality of bit lines in response to a first precharge signal;
    a column selection circuit, electrically coupled to the plurality of bit lines, to selectively connect each of the plurality of bits lines one-at-a-time to an output thereof in response to a column address signal;
    means, coupled to the output of the column selection circuit, for precharging the output of the column selection circuit in response to a second precharge signal; and
    means, coupled to the output of the column selection circuit, for sensing a potential of the output of said column selection circuit and amplifying the sensed potential to first or second binary logic potentials which indicate a state of a memory cell in said array.

2. The memory device of claim 1, further comprising means, electrically coupled to the plurality of bit lines, for discharging the plurality of bit lines in response to a discharge signal.

3. The memory device of claim 1, wherein said column selection circuit comprises a plurality of pass transistors having inputs electrically coupled to the plurality of bit lines; and wherein said means for precharging the plurality of bit lines comprises a plurality of pull-up transistors electrically connected to respective pass transistors in said column selection circuit.

4. The memory device of claim 3, wherein the plurality of pass transistors in said column selection circuit comprise PMOS transistors; and wherein the plurality of pull-up transistors comprise PMOS transistors.

5. The memory device of claim 2, wherein said column selection circuit comprises a plurality of pass transistors having inputs electrically coupled to the plurality of bit lines; wherein said discharging means comprises a plurality of pull-down transistors electrically coupled to the plurality of bit lines; and wherein said means for precharging the plurality of bit lines comprises a plurality of pull-up transistors electrically connected to respective pass transistors in said column selection circuit.

6. The memory device of claim 5, wherein the plurality of pass transistors in said column selection circuit comprise PMOS transistors; wherein the plurality of pull-up transistors comprise PMOS transistors; and wherein the plurality of pull-down transistors comprise NMOS transistors.

7. The memory device of claim 6, further comprising a plurality of NMOS pass transistors electrically connected in series between respective PMOS pull-up transistors and respective bit lines.

8. The memory device of claim 7, wherein the plurality of NMOS pass transistors are electrically connected in series between respective PMOS pass transistors in said column selection circuit and respective bit lines.

9. An integrated circuit memory device, comprising:
    an array of nonvolatile memory cells arranged as a plurality of pages of nonvolatile memory cells electrically coupled to a respective plurality of word lines and a plurality of columns of nonvolatile memory cells electrically coupled to a respective plurality of bit lines;
    means, electrically coupled to the plurality of bit lines, for precharging the plurality of bit lines in response to a first precharge signal;

a column selection circuit, electrically coupled to the plurality of bit lines, to selectively connect each of the plurality of bit lines one-at-a-time to an output thereof in response to a column address signal; means, coupled to the output of the column selection circuit, for precharging the output of the column selection circuit in response to a second precharge signal; and means, coupled to the output of the column selection circuit, for sensing a potential of the output of said column selection circuit and amplifying the sensed potential to first or second binary logic potentials which indicate a state of a nonvolatile memory cell in said array.

10. The memory device of claim 9, further comprising means, electrically coupled to the plurality of bit lines, for discharging the plurality of bit lines in response to a discharge signal.

11. The memory device of claim 9, wherein said column selection circuit comprises a plurality of pass transistors having inputs electrically coupled to the plurality of bit lines; and wherein said means for precharging the plurality of bit lines comprises a plurality of pull-up transistors electrically connected to respective pass transistors in said column selection circuit.

12. The memory device of claim 11, wherein the plurality of pass transistors in said column selection circuit comprise PMOS transistors; and wherein the plurality of pull-up transistors comprise PMOS transistors.

13. The memory device of claim 10, wherein said column selection circuit comprises a plurality of pass transistors having inputs electrically coupled to the plurality of bit lines; wherein said discharging means comprises a plurality of pull-down transistors electrically coupled to the plurality of bit lines; and wherein said means for precharging the plurality of bit lines comprises a plurality of pull-up transistors electrically connected to respective pass transistors In said column selection circuit.

14. The memory device of claim 13, wherein the plurality of pass transistors in said column selection circuit comprise PMOS transistors; wherein the plurality of pull-up transistors comprise PMOS transistors; and wherein the plurality of pull-down transistors comprise NMOS transistors.

15. The memory device of claim 14, further comprising a plurality of NMOS pass transistors electrically connected in series between respective PMOS pull-up transistors and respective bit lines.

16. The memory device of claim 15, wherein the plurality of NMOS pass transistors are electrically connected in series between respective PMOS pass transistors in said column selection circuit and respective bit lines.

17. The memory device of claim 16, wherein the nonvolatile memory cells comprise read-only memory cells.

18. The memory device of claim 16, wherein the nonvolatile memory cells comprise EEPROM cells.

* * * * *